(12) United States Patent
Gupta

(10) Patent No.: US 7,835,467 B2
(45) Date of Patent: Nov. 16, 2010

(54) DC OFFSET CORRECTION FOR HIGH GAIN COMPLEX FILTER

(75) Inventor: Ravi Gupta, Sunnyvale, CA (US)

(73) Assignee: Qualcomm, Incorporated, San Diego, CA (US)

( * ) Notice: Subject to any disclaimer, the term of this patent is extended or adjusted under 35 U.S.C. 154(b) by 790 days.

(21) Appl. No.: 11/325,804

(22) Filed: Jan. 5, 2006

(65) Prior Publication Data
US 2007/0153945 A1    Jul. 5, 2007

(51) Int. Cl.
H04L 27/06    (2006.01)
(52) U.S. Cl. .................... 375/319; 375/346
(58) Field of Classification Search ............. 375/319, 375/346, 344, 345, 235; 455/251.1, 252.1; 330/9
See application file for complete search history.

(56) References Cited

U.S. PATENT DOCUMENTS

| | | | |
|---|---|---|---|
| 5,760,629 A | 6/1998 | Urabe et al. | 327/307 |
| 5,898,912 A | 4/1999 | Heck et al. | 455/234.2 |
| 6,114,980 A | 9/2000 | Tilley et al. | 341/118 |
| 6,327,313 B1 | 12/2001 | Traylor et al. | 375/316 |
| 6,332,205 B1 * | 12/2001 | Conway | 714/746 |
| 6,356,217 B1 * | 3/2002 | Tilley et al. | 341/118 |
| 6,642,767 B2 | 11/2003 | Wang | 327/307 |
| 6,690,225 B2 | 2/2004 | Kondo et al. | 327/307 |
| 6,704,551 B2 | 3/2004 | Riou et al. | |
| 6,756,924 B2 | 6/2004 | Lee et al. | 341/120 |
| 6,775,530 B2 * | 8/2004 | Severson et al. | 455/324 |
| 6,806,756 B1 | 10/2004 | Manlove et al. | 327/307 |
| 6,909,882 B2 | 6/2005 | Hayashi et al. | 455/84 |
| 6,937,083 B2 | 8/2005 | Manlove et al. | 327/307 |
| 7,076,225 B2 * | 7/2006 | Li et al. | 455/245.1 |
| 7,409,189 B2 * | 8/2008 | Song | 455/67.11 |
| 2003/0174079 A1 * | 9/2003 | Soltanian et al. | 341/118 |
| 2003/0231054 A1 * | 12/2003 | Magoon et al. | 330/9 |
| 2004/0155703 A1 * | 8/2004 | Ravatin et al. | 330/9 |
| 2004/0247046 A1 * | 12/2004 | Hsiao | 375/319 |
| 2004/0252037 A1 | 12/2004 | Itoh | |
| 2005/0107056 A1 * | 5/2005 | Okasaka et al. | 455/251.1 |
| 2005/0136874 A1 * | 6/2005 | Yeo et al. | 455/296 |

(Continued)

OTHER PUBLICATIONS

"Design of Analog Integrated Circuits and Systems" by K. R. Laker et al., McGraw Hill, New York, NY, Jan. 1994, pp. 448-450.

(Continued)

Primary Examiner—Emmanuel Bayard
(74) Attorney, Agent, or Firm—Ramin Mobarhan

(57) ABSTRACT

A DC voltage offset correction circuit that provides for correction of a DC offset voltage of an output of a filter stage of a complex filter circuit includes a DC offset sensing device that is connected to an output of a filter stage of a complex filter to generate an offset presence signal indicating presence of the DC offset voltage at the output of the filter stage. The digital-to-analog converter applies a compensation signal to the output conditional on the offset presence signal. A programming register receives the offset presence signal to perform a binary search to generate a digital signal to force the digital-to-analog converter to apply the compensation voltage to the output of the filter stage. A filter controller sets the compensation voltage level in the programming register to match a programmed gain value of the filter stage.

22 Claims, 5 Drawing Sheets

U.S. PATENT DOCUMENTS

2005/0143032 A1  6/2005  Matsushita et al.
2007/0230524 A1* 10/2007  Li et al. .................. 372/38.01

OTHER PUBLICATIONS

"A 1.4V, 13.5mW, 10/100 MHz $6^{th}$ Order Elliptic Filer/VGA with DC-Offset Correction in 90nm CMOS," by Elmala et al., Digest of Papers 2005 IEEE.

Radio Frequency Integrated Circuits (RFIC) Symposium, Jun. 2005, pp. 189-192.

"A Highly Linear Filter and VGA Chain with Novel DC-Offset Correction in 90nm Digital CMOS Process," Elmala, et al., Digest of Technical.

Papers—2005 Symp on VLSI Circuits, Jun. 2005, pp. 302-303. A Novel Offset Compensation Biquad Switched-Capacitor Filter.

Design, Qiang et al., Proc—$5^{th}$ Int'l Conf. on ASIC, Oct. 2003, vol. 1, pp. 643-646.

International Search Authority-PCT/US07/00264, International Search Authority-ISA/US-Feb. 13, 2008.

Supplementary European Search Report-EP07709582, Search Authority-The Hague-Jan. 27, 2009.

Written Opinion-PCT/US07/00264, International Search Authority-ISA/US-Feb. 13, 2008.

* cited by examiner

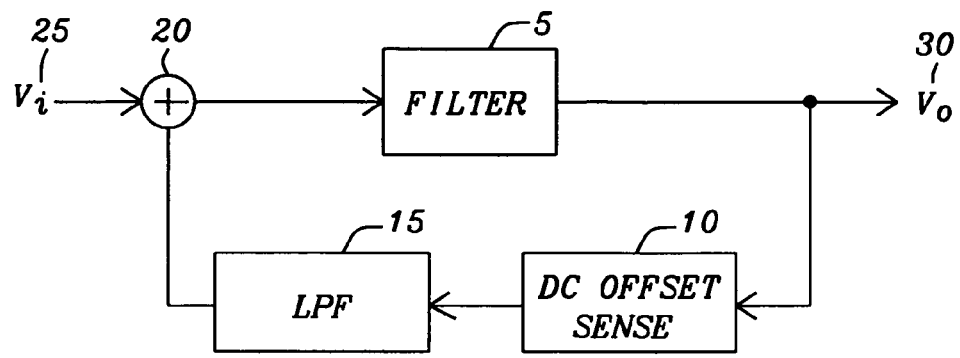
*FIG. 1 – Prior Art*
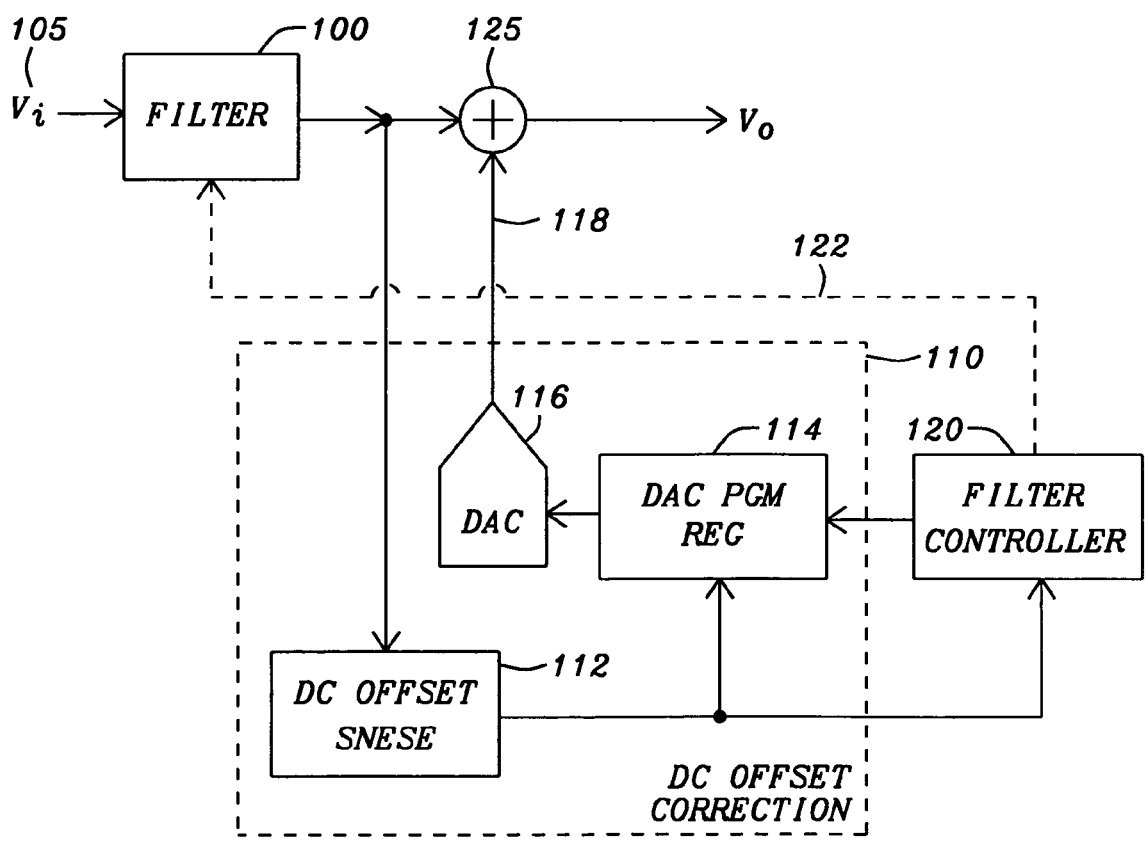
*FIG. 2*

DC OFFSET CORRECTION FOR HIGH GAIN COMPLEX FILTER

BACKGROUND OF THE INVENTION

1. Field of the Invention

This invention relates to methods and apparatus for correcting DC offset voltage in electronic circuits. More particularly, this invention relates to correction of DC offset compensation device automatically eliminating a DC offset voltage at the output of gain stage of a complex filter.

2. Description of Related Art

As is known in the art, the gain stages of a complex filter are operational amplifiers. It is further known in the art and explained in Design of Analog Integrated Circuits and Systems, Laker and Sansen, McGraw-Hill, New York, N.Y., January 1994, pp.: 448-450, "in an ideal op amp, if the input signal is zero, the output will also be zero. In an op amp, imperfections in the circuit components cause a DC voltage Vout to exist at the output, even when the input voltage is zero". "The response at DC is not always critical, but excessive DC offset will alter the output waveform symmetry about zero volts; possibly causing the waveform to clip over a smaller range of signal amplitudes than would occur if the DC offset were absent. In other words, positive (or negative) DC offset may cause clipping to occur for positive (or negative) signal swings at a lower amplitude than for negative (or positive) swings. Consequently, the dynamic range for the op amp is reduced. This is particularly a problem in high gain situations". In such situations, "a few millivolts of DC offset is amplified, with the signal, into the I V range. Applications like analog-to-digital converters require the DC voltages that represent digital codes to be determined very accurately. In these applications, internal offsets must be reduced to insignificance by offset nulling or auto-zero circuitry".

Generally, in complex filter design, as shown in FIG. 1, the DC offset of an output node of a filter 5 is sensed by a DC offset sensing circuit 10 to determine the voltage level of the DC offset of the filter circuit 5. A compensation or corrective voltage is generated by the DC offset sensing circuit 10 and applied to a low pass filter 15. The low pass filter has a very low cut off frequency such that it output voltage is essentially a slowly varying DC voltage. The output of the low pass filter 15 is applied to the summing circuit 20 to be combined with the input signal $v_i$ 25 as the input to the filter 5. The compensation voltage when multiplied by the gain of the filter 5 has a magnitude equal to and a polarity opposite the voltage level of the DC offset of the filter circuit 10.

"A 1.4V, 13.5 mw, 10/100 mhz 6th Order Elliptic Filter/VGA with DC-Offset Correction in 90 nm CMOS", Elmala, et al., Digest of Papers 2005 IEEE Radio Frequency Integrated Circuits (RFIC) Symposium, June 2005, pp.: 189-192, describes a highly linear variable gain amplifier (VGA) and filter operating at a low voltage with a DC-offset correction circuit. The DC-offset correction circuit rejects very low frequencies and requires very large resistances. The very large resistances are accomplished by operating transistors in a sub-threshold region.

"A Highly Linear Filter and VGA Chain with Novel DC-Offset Correction in 90 nm Digital CMOS Process", Elmala, et al., Digest of Technical Papers—2005 Symposium on VLSI Circuits, June 2005, pp.: 302-303 presents a base-band filter that consists of a 6th order elliptic filter and five VGA stages. The filter is DC-offset free and has two options for DC offset cancellation, based on rejecting very low frequencies using sub-threshold devices to emulate very large resistor The first option uses an inter-stage high pass filter with 0.3 KHz cutoff frequency, in the feed forward path. The second option uses a low pass filter with 0.3 KHz cutoff in the feedback path to detect the DC information and generate a correction current to the input of the VGA chain.

"A Novel Offset Compensation Biquad Switched-Capacitor Filter Design" Qiang et al, Proceedings—5th International Conference on ASIC, October 2003, Vol. 1, pp.: 643-646 describes a biquad SC filter used in an RFID reader. The filter compensates the DC offset comes from the input and the internal offset originated by the mismatch within the differential circuit of the filter. And the output offset of our design is determined by the input offset of the integrator in the feedback path.

U.S. Pat. Nos. 6,937,083 and 6,806,756 (Manlove, et al.) describe an analog signal conditioning circuit for processing an analog signal generated by a sensor to remove DC offset. The signal conditioning circuit includes an amplifier that has an input receiving an analog input signal and an input receiving a reference signal. The amplifier includes an output providing an analog output signal defined by an amplified representation of the analog input signal and the reference signal. The circuitry includes a feedback circuit that has an input coupled to the amplifier output and an output coupled to the input of the amplifier for providing an analog feedback signal. The feedback circuit includes an analog-to-digital converter for converting the analog amplifier output to a digital signal, a digital controller for processing the digital signal, and a digital to analog converter for converting the processed digital signal to an analog feedback signal.

U.S. Pat. No. 6,909,882 (Hayashi, et al.) provides a signal processing semiconductor integrated circuit that includes a dummy low noise amplifier is used for the DC offset calibrations on the subsequent stage amplifiers. The calibrations are carried out during shifting into the reception mode in a state that a signal low noise amplifier is deactivated and the dummy low noise amplifier is activated to suppress generation of the DC offsets resulting from the leakage noises of the local oscillator during shifting into the reception mode, and to enhance the reception sensitivity.

U.S. Pat. No. 6,690,225 (Kondo, et al.) provides a DC offset canceling circuit for cancellation of DC offset regardless in TDMA systems and non-TDMA systems. One output signal having at least two or more phases is an input to a phase converter unit. A signal is an output from the phase converter unit is compared within a comparator unit to any one of other signals not applied to the phase converter unit. A comparison result is fed back to a signal processing section and DC offset components are cancelled.

U.S. Pat. No. 6,756,924 (Lee, et al.) teaches a signal processing apparatus for correcting DC offset in a communication system. The signal processing apparatus includes a low noise amplifier (LNA). A mixer combines the output from the low noise amplifier with a local oscillation signal. A first offset correction amplifier amplifies an output signal from the mixer eliminates DC offset in the output signal based on a first control signal. A second offset correction amplifier amplifies an output signal from the first offset correction amplifier and eliminates DC offset in the output signal based on a second control signal. A variable gain amplifier amplifies the output from the second offset correction amplifier. The gain of the variable gain amplifier is controlled such that power level of output be maintained to a desired value. An offset calibration device calibrates the DC offset in output of the variable gain amplifier. An offset correction device proved the first and second control signals derived from the output from the offset calibration device to eliminate DC offset in the output from the variable gain amplifier.

U.S. Pat. No. 6,642,767 (Wang) provides an apparatus for DC offset canceling. A DC level fixing signal generator receives feedback input of two output signals from a mixer and generates a level fixing control signal to fix the DC level of the two output signals according to the input values. A DC offset canceling signal generator receives feedback input of two output signals from the mixer and generates offset canceling control signals to cancel the relative difference between the DC levels of the two output signals according to the input values. A DC level fixing and offset canceling circuit fixes the DC level of each of the two output signals from the mixer and cancels the relative difference between the DC levels of the two output signals according to the level fixing control signal and the offset canceling control signals.

U.S. Pat. No. 6,327,313 (Traylor, et al.) describes a method and apparatus for DC offset correction. The apparatus has a DC offset correction loop that utilizes a peak estimator to determine peaks associated with a digital signal. The peak estimator averages the peaks in order to estimate the DC offset. A summer sums the DC offset with the digital signal to produce a corrected output.

U.S. Pat. No. 6,114,980 (Tilley, et al.) illustrates a method and apparatus for settling a DC offset. The apparatus has a DC offset correction loop that utilizes a sign bit generator, a binary search stage, and a digital-to-analog converter in its feedback path to correct for DC offsets at the input of a gain stage.

U.S. Pat. No. 5,898,912 (Heck, et al.) teaches a direct current (DC) offset compensation method and apparatus within a receiver. The receiver includes input, output, forward path with filter, and feedback path with error amplifier coupled into the forward path. Coupled to the feedback path is an error signal storage device. A control circuit responds to input signal amplitude and is coupled to the storage device to retrieve stored error signal information for use by the feedback path. During calibration, a forward path stage is stimulated with a plurality of signals of known amplitude to generate outputs. The outputs are compared to a reference to generate error signals. The error signal values are stored in memory as a function of input signal amplitude. During operation, stage input signals are detected and compared with the signals of known amplitude. Upon detection of a match, the error signal value associated with the signal of interest is retrieved from memory and employed during DC offset compensation.

U.S. Pat. No. 5,760,629 (Urabe, et al.) describes a DC offset compensation device. The device has a level detector that detects variation of the amplitude of an input signal to output a level signal. A time constant control signal generates a time constant control signal based on the level signal to control a time constant of an estimator so as to make the time constant small for a prescribed period from a time when the level signal varies from HIGH to LOW. The estimator estimates DC offset included in the input signal with the time constant variation according to the time constant control signal to output an estimate. A compensator subtracts the estimate from the input signal to obtain a compensation output. Therefore, in the estimator, the speed of estimating the DC offset is different between a period corresponding to the head portion of the input signal and other periods. Thus, a DC offset compensation device can be configured to be capable of fast DC offset compensation at the head portion of the input signal and have stable DC offset compensation at the other portions.

SUMMARY OF THE INVENTION

An object of this invention is to provide for correction and compensation of a DC offset voltage of an output of a filter stage of a complex filter circuit.

To accomplish at least this object, a DC voltage offset correction circuit includes a DC offset sensing device and an digital-to-analog converter. The DC offset sensing device is connected to an output of a filter stage of a complex filter to generate an offset presence signal indicating presence of the DC offset voltage at the output of the filter stage. The digital-to-analog converter is in communication with the DC offset sensing device and connected to the output of the filter stage to apply a compensation signal to the output conditional on the offset presence signal.

The DC voltage offset correction circuit further includes a programming register in communication with the DC offset sensing device to receive the offset presence signal. The programming register performs a binary search to generate a digital signal indicative of a magnitude of the compensation signal. The programming register is in communication with the digital-to-analog converter to transfer the digital signal to the digital-to-analog converter to force the digital-to-analog converter to apply the compensation voltage to the output of the filter stage. A filter controller in communication with the programming register to set the compensation voltage level to match a programmed gain value of the filter stage.

The DC offset sensing device is essentially a voltage comparator having an in-phase input connected to an in-phase output of the filter stage and an out-of-phase input connected to an out-of-phase output of the filter stage. The voltage comparator compares the voltage levels present at the in-phase output and the out-of-phase output of the filter stage to determine the presence of the DC offset voltage. The offset presence signal is a one bit binary signal provided by the voltage comparator indicating the presence of the DC offset voltage.

BRIEF DESCRIPTION OF THE DRAWINGS

FIGS. 1 is a block diagram of a filter stage with DC offset compensation of the prior art.

FIG. 2 is a block diagram of a filter stage of a complex filter illustrating the DC compensation of this invention.

DETAILED DESCRIPTION OF THE INVENTION

Figure 3:
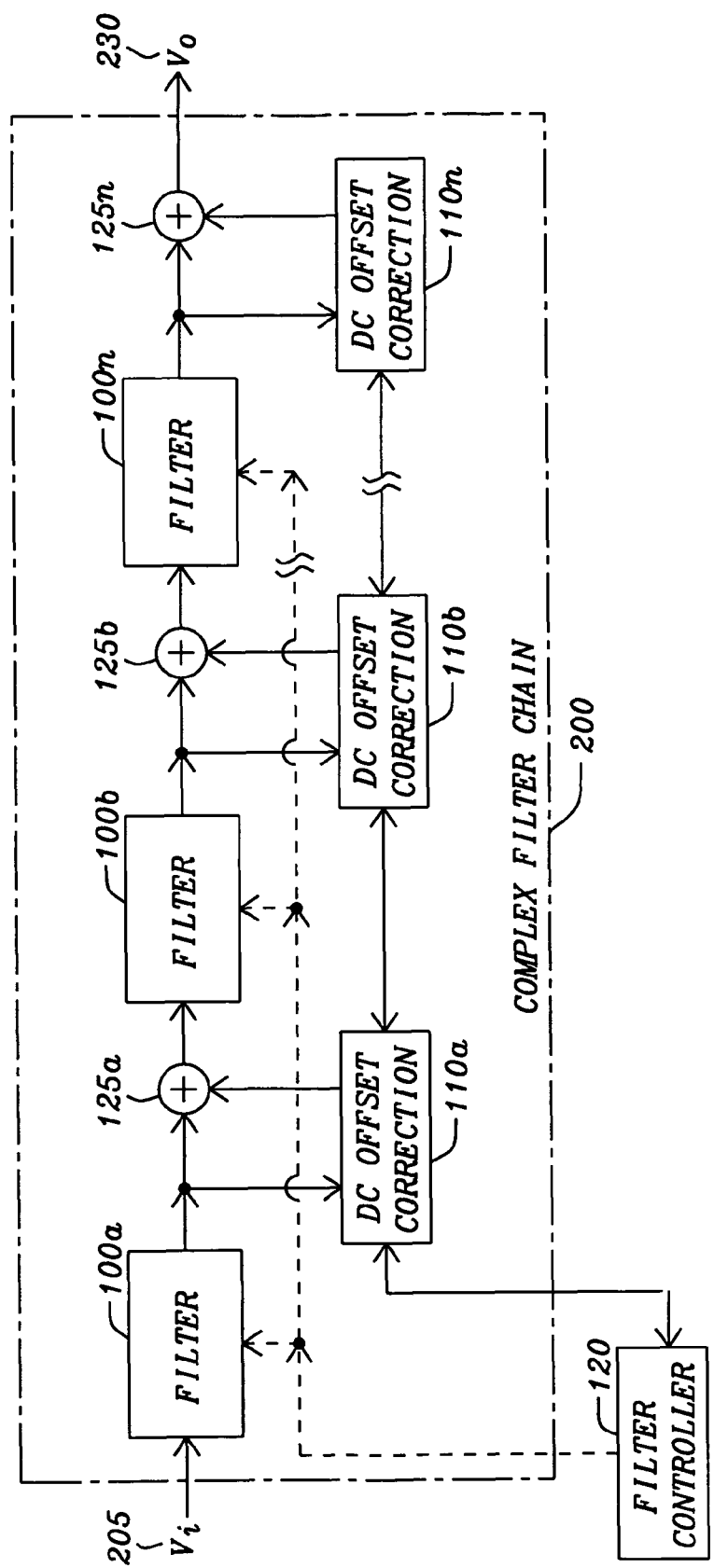
FIG. 3 is a block diagram of a complex filter illustrating the DC compensation of this invention.

A DC voltage offset correction circuit of this invention provides for correction and compensation of a DC offset voltage of an output of a filter stage of a complex filter circuit and includes a DC offset sensing device and a digital-to-analog converter. The DC offset sensing device is connected to an output of a filter stage of a complex filter to generate an offset presence signal indicating presence of the DC offset voltage at the output of the filter stage. The digital-to-analog converter is in communication with the DC offset sensing device and connected to the output of the filter stage to apply a compensation signal to the output conditional on the offset presence signal.

A programming register is in communication with the DC offset sensing device to receive the offset presence signal. From the offset presence signal, the programming register performs a binary search to generate a digital signal indicative of a magnitude of the compensation signal. The programming register communicates the digital signal to the digital-to-analog converter to force the digital-to-analog converter to apply the compensation voltage to the output of the filter stage. A filter controller sets the compensation voltage level coding in the programming register to match a programmed gain value of the filter stage.

Refer now to FIG. 1 for a more complete discussion of the DC voltage offset correction circuit of this invention. As is known in the art, a fundamental component of a complex filter is a filter gain stage 100 that is generally created from an operational amplifier. As described above, the imperfections in the circuit components of the operational amplifier cause a DC voltage to be generated at the output, even when a zero input voltage ($V_i$ 105). Excessive DC offset will alter the output ($V_o$ 130) waveform symmetry about zero volts and may cause clipping over a smaller range of signal amplitudes than would occur if the DC offset were absent. This offset reduces the dynamic range of the operational amplifier is reduced. This is particularly a problem in high gain situations where a an input voltage $V_i$ 105 of a few millivolts of DC offset is amplified into the operational range of the application.

The DC offset correction circuit 110 senses the output voltage of the filter gain stage 100, determines the presence of a DC offset voltage and generates a correcting offset voltage 118. The correcting offset voltage 118 is the input to the summing circuit 125 to generate the output signal $V_o$ 130. The DC offset correction circuit 110 has a DC offset voltage sensing circuit 112 that senses the presence of the DC offset voltage at the output of the filter gain stage 100. In the preferred embodiment the output of the filter gain stage 100 is a differential pair of outputs and the DC offset voltage sensing circuit 112 is a comparator that compares the difference of the voltage between the differential pair of outputs of the filter gain stage 100. From this difference, the DC offset voltage sensing circuit 112 generates a digital code (a single bit) indicating there is a DC offset voltage. The digital offset signal code is applied to the digital-to-analog program register 114 and the filter controller 120.

The filter controller 120 is in communication 122 with the filter 100 to programmably adjust its gain. The gain of the filter gain stage 100 determines the level of the DC offset voltage. The filter controller 120 sends a digital coding to the digital-to-analog program register 114 to represent the voltage level of the compensation signal based on the programmed gain of the filter 100. The output of the comparator (DC offset voltage sensing circuit 112) is a one bit digital signal indicating the voltage level of the compensation signal. This one bit digital signal acts as an address for the digital-to-analog program register 114. The digital-to-analog program register 114 applies the code for the voltage level of the compensation signal based on the one bit digital signal to the digital-to-analog converter 116. The digital-to-analog converter 116 adjusts its output voltage to generate the appropriate compensation signal to be applied to the signal combiner 125 to be combined with the output signal of the filter 100 with the compensation signal from the digital-to-analog converter 116. The signal combiner may be a summing circuit or simply a wiring node between output of the filter gain stage 100 and the digital-to-analog converter 116.

Refer now to FIG. 3 for a discussion of the complex filter chain 200. The complex filter chain has a series of filter gain stages 100a, 100b, ..., 100n. An input signal 205. Each filter gain stage 100a, 100b, ..., 100n has a DC offset correction circuit 110a, 110b, ..., 110n that is connected to sense the DC offset voltage present to a the output of each filter gain stage 100a, 100b, ..., 100n.

The output of each DC offset correction circuit 110a, 110b, ..., 110n has an output connected to the combiner 125a, 125b, ..., 125n to combine the generated compensation signal from each DC offset correction circuit 110a, 110b, ..., 110n with the output of each filter gain stage 100a, 100b, ..., 100n. As described above, Each combiner 125a, 125b, ..., 125n is either a summing circuit or simply a wiring node between output of each of the filter gain stages 100a, 100b, ..., 100n and the digital-to-analog converter 116 of each of the DC offset correction circuits 110a, 110b, ..., 110n.

The filter controller is in communication with each of the filter gain stages 100a, 100b, ..., 100n to adjust the gains for each of the filter gain stages 100a, 100b, ..., 100n. The DC offset voltage of each of the filter gain stages 100a, 100b, ..., 100n is determined as a function of the programmed gain of each of the filter gain stages 100a, 100b, ..., 100n. The filter controller programs the digital-to-analog program register of each of the DC offset correction circuit 110a, 110b, ..., 110n. The DC offset sense circuit of each of the DC offset correction circuit 110a, 110b, ..., 110n determines the DC offset voltage at the output of its attached filter gain stage 100a, 100b, ..., 100n and activates the address line to the digital-to-analog program register of each of the DC offset correction circuit 110a, 110b, ..., 110n which then provides the digital code for the compensation signal level to the digital-to-analog converter of the DC offset correction circuit 110a, 110b, ..., 110n. The output of the digital-to-analog converter of each of the DC offset correction circuits 110a, 110b, ..., 110n is appropriately applied to the combiner 125a, 125b, ..., 125n to compensate for the DC offset voltage.

Figure 4:
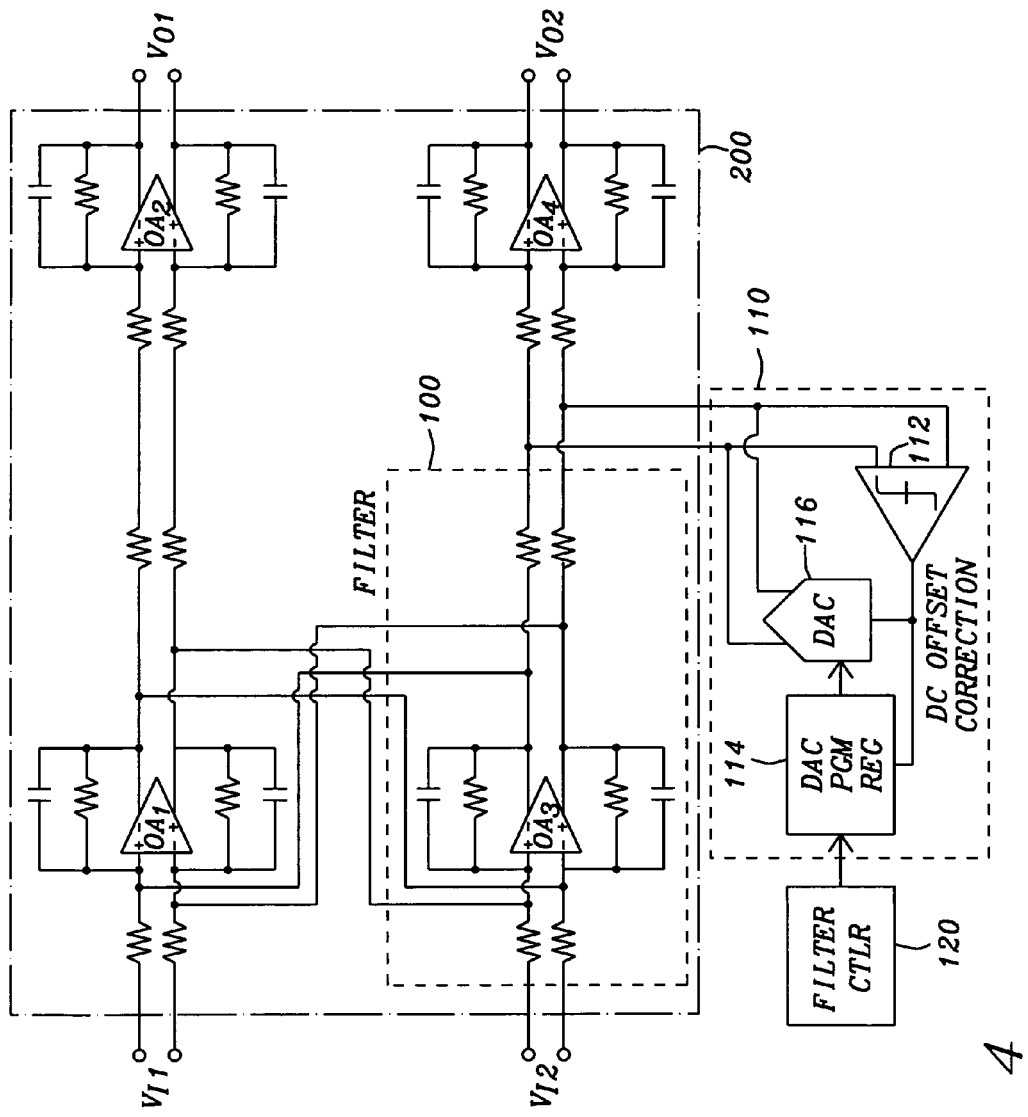
FIG. 4 is a schematic diagram of a filter stage of a complex filter illustrating the DC compensation of this invention.

FIG. 4 provides a schematic drawing of a complex filter 200 that incorporates a programmed filter gain stage 100. At the output of the filter gain stage 100 at DC offset correction circuit 110 is connected to sense the DC offset voltage and provide the necessary DC offset voltage compensation signal. The comparator is the DC offset voltage sensing circuit 112 with its input connected to determine the voltage level of the DC offset voltage. The output of the comparator 112 is applied as a one bit digital code to the digital-to-analog converter 116 and the digital-to-analog program register 114 address the digital-to-analog converter 116 to generate the DC offset voltage compensation signal.

The filter controller 120 is in communication with the filter gain stage 100 to program its gain and from its gain, the filter controller 120 programs the digital-to-analog program register 114 with the appropriate code to represent the required voltage compensation offset signal. The output of the digital-to-analog converter 116 is connected to the output of the filter gain stage 100 to provide the DC Offset compensation signal that corrects the DC offset voltage of the filter gain stage 100.

Figure 5:
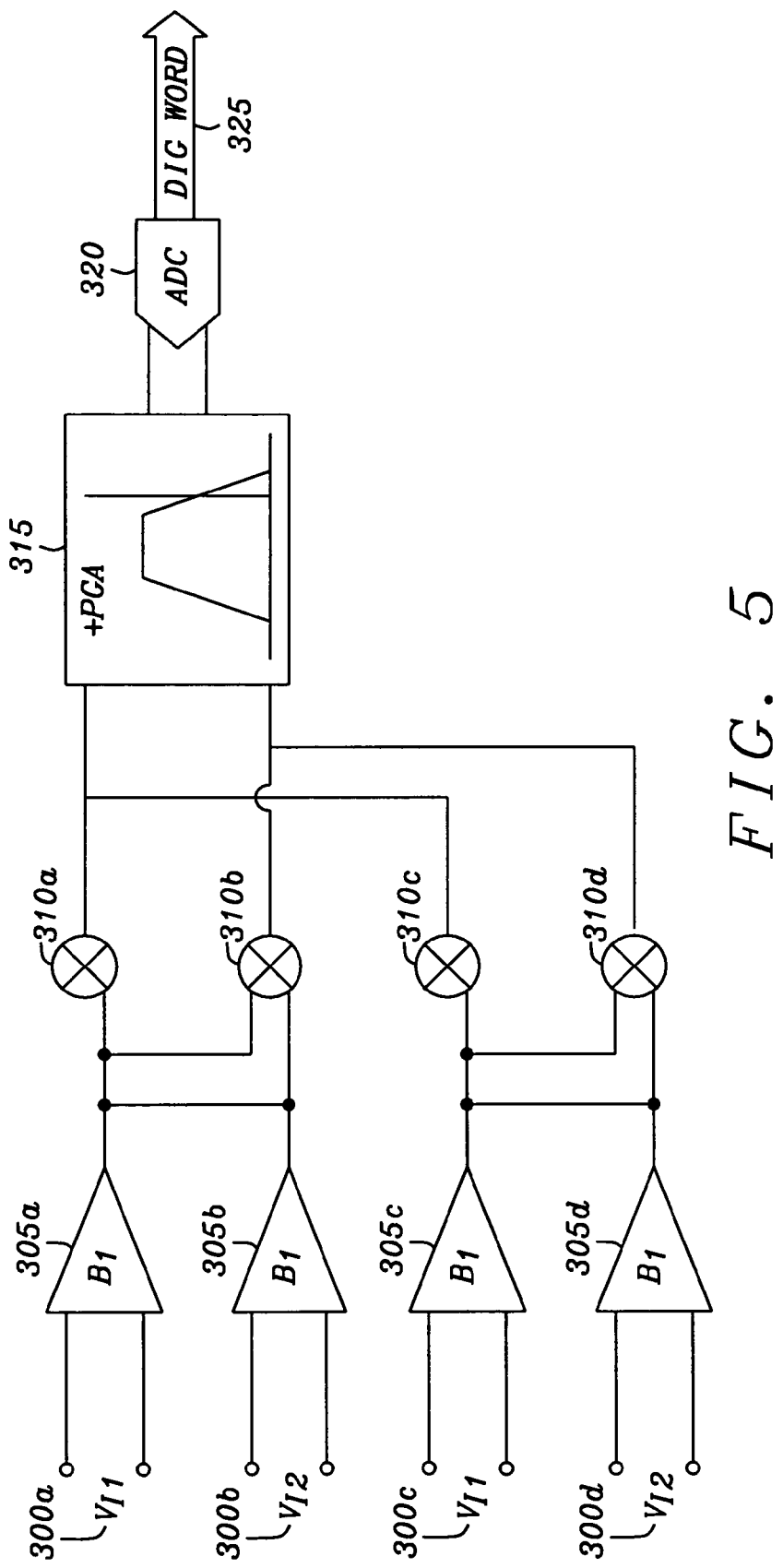
FIG. 5 is a schematic diagram of a complex filter of this invention.

A system employing a complex filter incorporating a DC offset correction circuit is illustrated in FIG. 5. The input signals 300a, 300b, 300c, and 300d are respectively applied to the buffer circuits 305a, 305b, 305c, and 305d. The outputs of the buffer circuits 305a, 305b, 305c, and 305d are the inputs to the multiplier circuits 310a, 310b, 310c, and 310d to generate the appropriate cross products that are inputs to the complex filter 315 have programmed gain amplifier stages. The complex filter 315 is essentially structured as shown in FIG. 4 and incorporates the DC offset correction circuit of this invention as described in FIG. 2. The output of the complex filter 315 in this application is connected to an analog-to-digital converter 320 which samples and creates a digital code 325 representing the amplitude of the output signal of the complex filter 315.

Figure 6:
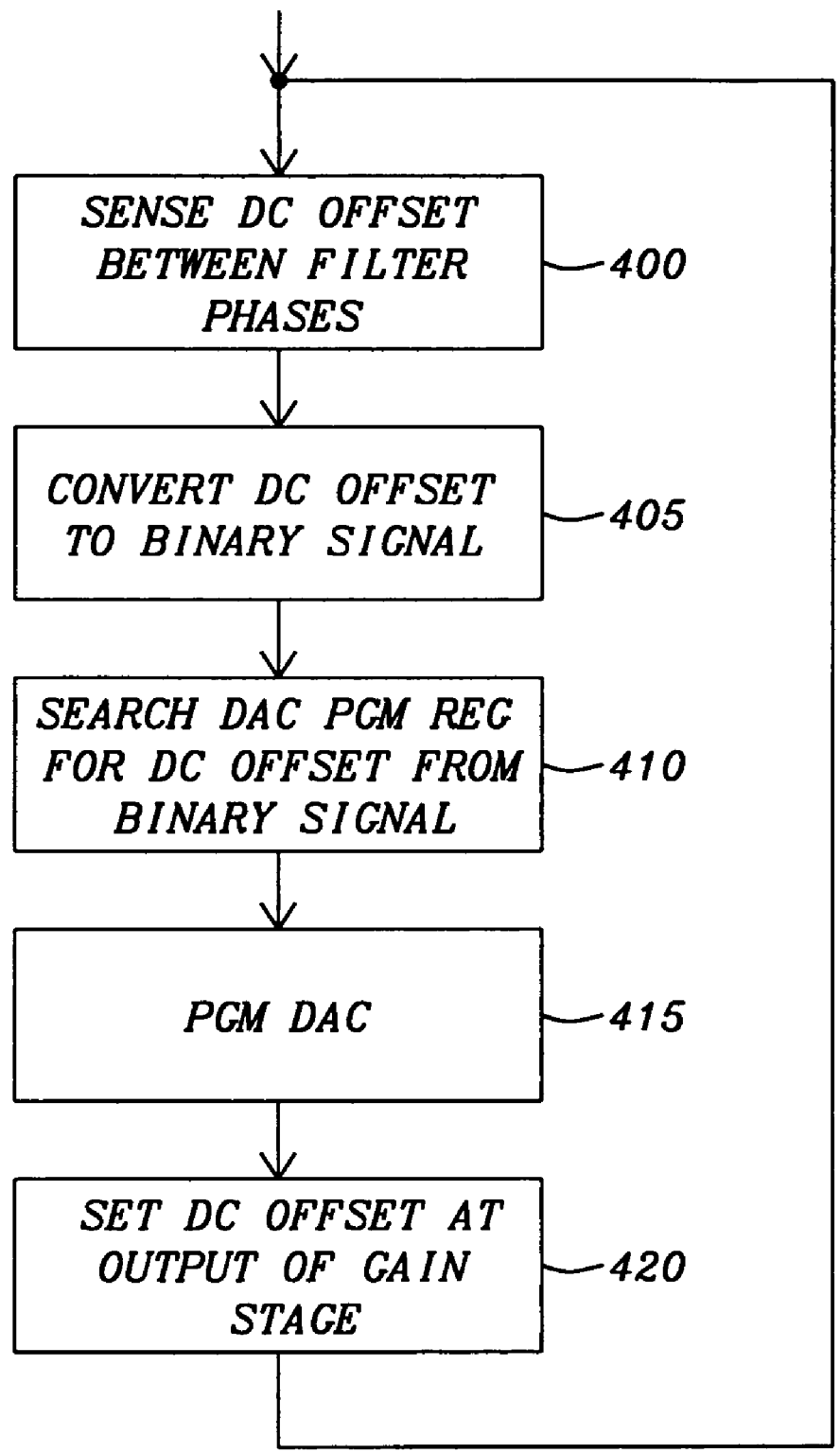
FIG. 6 is a flow chart of a process for correcting a DC offset voltage at an output of a filter stage of a complex filter.

In summary and shown in FIG. 6 as a flow diagram, the DC offset correction for each of the programmed filter gain stages of a complex filter begins by sensing (Box 400) the offset voltage between phase of the output of the programmed filter gain stages. The offset voltage is converted (Box 405) to a binary digital code indicating the level of the offset voltage. In the DC offset voltage sensing circuit 112 described in FIG. 2, the DC offset voltage is encoded as a single bit binary code indicating the presence of the DC offset voltage. The binary signal is used to search (Box 410) the contents of a digital-to-analog program register 114 of FIG. 2 to determine the level of the DC voltage offset compensation voltage.

The digital-to-analog program register 114 is programmed by the filter controller 120 of FIG. 2. The filter controller 120 programs the programmed filter gain stages and determines the operation levels of the DC voltage offset. The search (Box 410) selects the digital code that programs (Box 415) the digital-to-analog converter 116 of FIG. 2. The output of the digital-to-analog converter 116 then sets (Box 420) its output voltage to the appropriate DC offset voltage compensation level to correct the DC offset voltage at the output of the programmed filter gain stage.

While this invention has been particularly shown and described with reference to the preferred embodiments thereof, it will be understood by those skilled in the art that various changes in form and details may be made without departing from the spirit and scope of the invention.

The invention claimed is:

1. A DC voltage offset correction circuit for compensating for a DC offset voltage of an output of a filter stage of a complex filter circuit, comprising:
   a DC offset sensing device to generate an offset presence signal indicating presence of said DC offset voltage at the output of said filter stage;
   a digital-to-analog converter in communication with said DC offset sensing device and connected to said output of said filter stage to apply a compensation signal to said output conditional on said offset presence signal; and
   a filter controller in communication with said DC offset sensing device and connected to said filter stage to adjust gain of said filter stage conditional on said offset presence signal and to determine the compensation signal based on the gain as adjusted.

2. The DC voltage offset correction circuit of claim 1 further comprising a programming register in communication with said DC offset sensing device to receive said offset presence signal, said programming register performing a binary search to generate a digital signal indicative of a magnitude of said compensation signal.

3. The DC voltage offset correction circuit of claim 2 wherein said programming register is in communication with said digital-to-analog converter to transfer said digital signal to said digital-to-analog converter to force said digital-to-analog converter to apply said compensation voltage to said output of said filter stage.

4. The DC voltage offset correction circuit of claim 2 wherein said a filter controller is in communication with said programming register to set said compensation voltage level to match a programmed gain value of said filter stage.

5. The DC voltage offset correction circuit of claim 1 wherein said DC offset sensing device comprises a voltage comparator having an in-phase input connected to an in-phase output of said filter stage and an out-of-phase input connected to an out-of-phase output of said filter stage for comparing voltage levels present at said in-phase output and said out-of-phase output of said filter stage to determine the presence of said DC offset voltage.

6. The DC voltage offset correction circuit of claim 5 wherein said offset presence signal is a one bit binary signal provided by said voltage comparator indicating said presence of said DC offset voltage.

7. A complex filter comprising:
   a plurality of filter stages interconnected to filter undesired frequency components from an input signal; and
   a plurality of DC voltage offset correction circuit wherein each of said DC voltage offset correction circuits is connected to an output of one of said plurality of filter stages for compensating for a DC offset voltage of said filter stage, said DC voltage offset correction circuit comprising:
      a DC offset sensing device to generate an offset presence signal indicating presence of said DC offset voltage at the output of said filter stage;
      a digital-to-analog converter in communication with said DC offset sensing device and connected to said output of said filter stage to apply a compensation signal to said output conditional on said offset presence signal; and
      a filter controller in communication with said DC offset sensing device and connected to said one of said plurality of filter stages to adjust gain of said filter stage conditional on said offset presence signal and to determine the compensation signal based on the gain as adjusted.

8. The complex filter of claim 7 wherein said DC voltage offset correction circuit further comprises a programming register in communication with said DC offset sensing device to receive said offset presence signal, said programming register performing a binary search to generate a digital signal indicative of a magnitude of said compensation signal.

9. The complex filter of claim 8 wherein said programming register is in communication with said digital-to-analog converter to transfer said digital signal to said digital-to-analog converter to force said digital-to-analog converter to apply said compensation voltage to said output of said filter stage.

10. The complex filter of claim 8 wherein DC voltage offset correction circuit including said filter controller is in communication with said programming register to set said compensation voltage level to match a programmed gain value of said filter stage.

11. The complex filter of claim 7 wherein said DC offset sensing device comprises a voltage comparator having an in-phase input connected to an in-phase output of said filter stage and an out-of-phase input connected to an out-of-phase output of said filter stage for comparing voltage levels present at said in-phase output and said out-of-phase output of said filter stage to determine the presence of said DC offset voltage.

12. The complex filter of claim 11 wherein said offset presence signal is a one bit binary signal provided by said voltage comparator indicating said presence of said DC offset voltage.

13. A method for correcting a DC offset voltage of an output of a filter stage of a complex filter circuit, comprising the steps of:
   sensing a DC offset voltage at said output of said filter stage;
   generating an offset presence signal indicating presence of said DC offset voltage at the output of said filter stage;
   converting said offset presence signal to an analog compensation;
   applying a compensation signal to said output of said filter stage conditional on said offset presence signal; and
   adjusting gain of said filter stage conditional on said offset presence signal and to determine the compensation signal based on the gain as adjusted.

14. The method for correcting a DC offset voltage of claim 13 further comprising the steps of:
   retaining a plurality of voltage level magnitudes from which said compensation level is selected; and
   performing a binary search said plurality of voltage level magnitudes to determine which of said voltage levels is selected to be said compensation signal based on said offset presence signal;
   generating said compensation signal from said determined voltage level magnitude.

15. The of claim 14 further comprising the steps of setting said compensation voltage level to match a programmed gain value of said filter stage.

16. The method for correcting a DC offset voltage of claim 13 wherein sensing a DC offset voltage at said output of said filter stage is performed by a voltage comparator having an in-phase input connected to an in-phase output of said filter stage and an out-of-phase input connected to an out-of-phase output of said filter stage for comparing voltage levels present at said in-phase output and said out-of-phase output of said filter stage to determine the presence of said DC offset voltage.

17. The method for correcting a DC offset voltage of claim 16 wherein said offset presence signal is a one bit binary signal provided by said voltage comparator indicating said presence of said DC offset voltage.

18. An apparatus for correcting a DC offset voltage of an output of a filter stage of a complex filter circuit, comprising:
   means for sensing a DC offset voltage at said output of said filter stage;
   means for generating an offset presence signal indicating presence of said DC offset voltage at the output of said filter stage;
   means for converting said offset presence signal to an analog compensation;
   means for applying a compensation signal to said output of said filter stage conditional on said offset presence signal; and
   means for adjusting gain of said filter stage conditional on said offset presence signal and to determine the compensation signal based on the gain as adjusted.

19. The apparatus for correcting a DC offset voltage of claim 18 further comprising:
   means for retaining a plurality of voltage level magnitudes from which said compensation level is selected; and
   means for performing a binary search said plurality of voltage level magnitudes to determine which of said voltage levels is selected to be said compensation signal based on said offset presence signal;
   means for generating said compensation signal from said determined voltage level magnitude.

20. The apparatus for correcting a DC offset voltage of claim 19 further comprising means for setting said compensation voltage level to match a programmed gain value of said filter stage.

21. The apparatus for correcting a DC offset voltage of claim 18 wherein said means for sensing a DC offset voltage at said output of said filter stage comprises a voltage comparator having an in-phase input connected to an in-phase output of said filter stage and an out-of-phase input connected to an out-of-phase output of said filter stage for comparing voltage levels present at said in-phase output and said out-of-phase output of said filter stage to determine the presence of said DC offset voltage.

22. The apparatus for correcting a DC offset voltage of claim 21 wherein said offset presence signal is a one bit binary signal provided by said voltage comparator indicating said presence of said DC offset voltage.

* * * * *